United States Patent [19]
Ngo

[11] Patent Number: 5,599,655
[45] Date of Patent: Feb. 4, 1997

[54] PHOTOIMAGEABLE POLYIMIDE COATING

[75] Inventor: David D. Ngo, Naperville, Ill.

[73] Assignee: Amoco Corporation, Chicago, Ill.

[21] Appl. No.: 627,470

[22] Filed: Apr. 4, 1996

Related U.S. Application Data

[62] Division of Ser. No. 450,915, May 26, 1995, Pat. No. 5,532,110, which is a division of Ser. No. 269,698, Jul. 1, 1994, Pat. No. 5,501,941, which is a continuation of Ser. No. 865,069, Apr. 8, 1992, abandoned, which is a continuation of Ser. No. 522,363, May 8, 1990, abandoned.

[51] Int. Cl.$^6$ ....................................... G03C 5/00
[52] U.S. Cl. .................... 430/325; 430/270.1; 430/275.1
[58] Field of Search .................................. 430/325, 270.1, 430/275.1

[56] References Cited

U.S. PATENT DOCUMENTS

| | | | |
|---|---|---|---|
| 4,786,569 | 11/1988 | Rohde et al. | 430/14 |
| 4,912,197 | 3/1990 | Hayes | 528/353 |
| 4,925,912 | 5/1990 | Rohde et al. | 528/226 |
| 4,935,320 | 6/1990 | Rohde et al. | 430/14 |
| 5,206,091 | 4/1993 | Beuhler et al. | 428/446 |

*Primary Examiner*—Mark Chapman
*Attorney, Agent, or Firm*—Mary Jo Kanady; Wallace L. Oliver

[57] ABSTRACT

A photoimageable polyimide coating which can be prepared from the polymeric condensation product of 6FDA, DMDE or MEDA, and a photosensitizing moiety. More particularly, the present invention relates to a photoimageable polyimide coating useful for microelectronic applications.

10 Claims, No Drawings

PHOTOIMAGEABLE POLYIMIDE COATING

This is a divisional of application Ser. No. 08/450,915, filed May 26, 1995, now U.S. Pat. No. 5,532,110 which is a divisional of application Ser. No. 08/269,698 filed Jul. 1, 1994, now U.S. Pat. No. 5,501,941 which is a continuation of application Ser. No. 07/856,069 filed Apr. 8, 1992 now abandoned, which is a continuation of application Ser. No. 07/522,363 filed May 8, 1990 now abandoned.

This invention relates to a photoimageable polyimide coating. More particularly, the present invention relates to a photoimageable polyimide coating useful for microelectronic applications.

BACKGROUND OF THE INVENTION

Aromatic polyimides have found extensive use in industry as fibers, composites, molded parts and dielectrics due to their ease of coating, toughness, flexibility, mechanical strength and high thermal stability. In the electronic industry, polyimides have proven to be useful due to their low dielectric constant and high electrical resistivity. Such polymers have been used in both film and coating form as advanced materials for such uses as interlevel dielectrics, passivation coatings, insulating coatings, die attach adhesives, flexible circuit substrates, and the like.

Many electronic applications, for example, passivation coatings or interlevel dielectrics, require that vias (or openings) be etched through the polymer coatings to permit access for electrical connections that run between the substrate and the outside environment.

Etching vias through polyimides, or their polyamic acid precursor, requires a multistep procedure. The polymer is generally dissolved in solution and the resulting solution of polymer is spread on a substrate to form a coating. In the case of polyamic acid, the coating is further coated with a photoresist material which itself is in a solvent and that solvent is removed, typically by heating (also called soft baking). The photoresist material is then shielded with a mask containing a pattern of openings and the photoresist material is exposed to actinic radiation. Thus, the photoresist material is photochemically altered such that the areas that were exposed to actinic radiation are soluble and vias (or openings) are created by taking advantage of this selective solubility to develop and remove specific areas of photoresist material. Then, the polyamic acid coating can be etched. After the polyamic acid is etched, forming vias in the polyamic acid coating, the remaining photoresist material is removed. Thereafter, the polyamic acid is imidized, generally by heating, generally in a range of from about 200° C. to about 400° C., to form the final coating.

Thus, etching can be viewed as a multistep process to dissolve selected areas of polyamic acid coating on a substrate with an appropriate solvent to form vias (or openings) in the coating. However, the number of steps involved in the process would be substantially reduced if photosensitivity could be incorporated into the polymer so that a photosensitive polymer could be applied to the substrate and patterned directly, i.e., without the need for the application and removal of a photoresist material. The number of steps would be further reduced if the polymer coating could be applied as a polyimide, thereby eliminating the imidization step. By reducing the number of process steps, the production of each electronic component will take less time and overall production will be more efficient.

Early attempts to provide photosensitive polymers used photosensitive polyamic acid derivatives. For example, several known polyamic acid derivatives are based on the formation of a polyamic ester. Extensions of this technology are found in U.S. Pat. Nos. 4,416,973 (photocrosslinking olefinic groups), 4,430,418 (halogen-containing amines), and 4,454,220 (polyamic acid). In general, the photosensitive polyamic acid precursor is formed by first reacting a dianhydride, such as pyromellitic dianhydride (PMDA), with an allylic alcohol to form a diacid-diester. The diacid-diester is reacted with thionyl chloride to form the bis-acid chloride. Reaction of the acid chloride with a diamine, such as oxybisaniline (OBA), yields the photosensitive polyamic ester. Upon irradiation, the olefinic groups undergo a photochemically allowed (2+2) cycloaddition reaction. This cross-links the polyamic ester and reduces the solubility of the area that was exposed to radiation. After development, a high temperature cure (400° C.) results in elimination of the cross-linking groups and imidization of the polyamic acid to form the polyimide, in this case pyromellitic acid dianhydride/oxybisaniline (PMDA/OBA). It is theorized that the majority of the cross-linking groups are lost as the allylic alcohol (Ahne et al., Proc. of the ACS Div. of Polymeric Materials: Science and Engineering, Vol.55, 406–412 (1986)). It is this loss of allylic alcohol that is believed to be responsible for much of the shrinkage in these materials, ranging from 40 to 60 weight percent.

Shrinkage is a significant problem which may cause delamination of the film from the substrate because of the internal stress that builds up in the film from the polymer shrinkage. Further, in order to compensate for polymer shrinkage, the mask design must be adjusted so that the final pattern features have the correct dimensions. For example, in order to pattern 10 micron features from a polymer having a 45 percent thickness loss and a 20 percent loss in linewidth, one would need a 12 micron pattern. Further, the degree of feature shrinkage can vary from one polymer to another; therefore, the shrinkage characteristics of each new polymer must be determined in order to compensate for that polymer's unique characteristics.

Some have tried to overcome the shrinkage problem by providing a cured polyimide with photoimageable properties incorporated into the polymer backbone. Rohde, O., 3rd Annual International Conference on Crosslinked Polymers, Luzern, Switzerland, 197–208 (1989), discloses a photoimageable polyimide prepared from pyromellitic acid dianhydride (PMDA) and 2,2',6,6'-tetramethyl-4,4'-methylenedianiline (TMMA).

U.S. Pat. No. 4,912,197 discloses transparent-to-clear aromatic polyimides. The polyimide 2,2-bis(3,4-dicarboxyphenyl)-hexafluoropropane dianhydride/2,3,5,6-tetramethyl-1,4-phenylene diamine (6FDA/DMDE) is disclosed; However, this reference does not teach the present invention. In fact, this reference specifically requires the presence of 3,3',4,4'-benzophenone tetracarboxylic acid dianhydride (BTDA) to provide photochemical crosslinking. Although the present invention provides that a photosensitizing moiety, such as BTDA, may be incorporated into the polymer to increase photosensitivity, photoimageability does not depend on the presence of the photosensitizing moiety.

U.S. Pat. Nos. 4,705,540 and 4,717,394 disclose 6FDA/DMDE-containing polyimides for gas separation membranes. U.S. Pat. No. 4,717,393 discloses auto-photochemically crosslinkable gas separation membranes. This reference discloses from 5 to 100 percent BTDA and attributes the photo-crosslinking to absorption of photochemical energy by the benzophenone chromophore.

U.S. Pat. No. 4,629,777 discloses photoimageable polyimide systems from BTDA and aromatic diamines which carry ortho-aliphatic substituents. However, this reference does not teach the use of 6FDA, which is considered to be important to provide the transparency and low color found in the photoimageable polyimide coatings of the present invention.

U.S. Pat. No. 4,656,116 discloses radiation-sensitive coating compositions that crosslink on exposure to actinic radiation. However, this reference does not teach the use of 6FDA.

Other references disclose 6FDA-containing polyimides, for example, U.S. Pat. No. 3,822,202 discloses gas separation membranes containing 6FDA, BTDA, and generally substituted phenylene diamines. U.S. Pat. No. 3,356,648 generally discloses polyamic acids and polyimides from hexafluoropropylidine-bridged diamines. U.S. Pat. No. 3,959,350 discloses a melt-fusible linear polyimide of 6FDA and m- or p-phenylene diamines. Published Japanese Application 63/333,746 discloses a resin film pattern formation method for polyisoimides which are derived from various diamines and dianhydrides, including 6FDA.

While these references generally disclose photoimageable polyimides, they do not disclose the photoimageable polyimide coatings of the present invention having the properties described.

SUMMARY OF THE INVENTION

The present invention provides a photoimageable coating from a polyimide

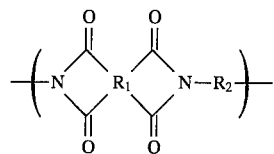

wherein $R_1$ comprises 1 to 100 mole percent

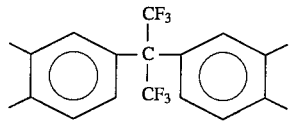

and 99 to 0 mole percent tetravalent photosensitizing moiety and wherein $R_2$ comprises 1 to 100 mole percent

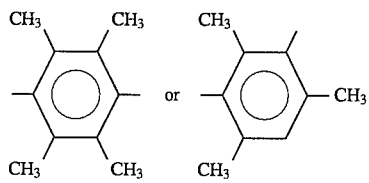

and 99 to 0 mole percent divalent photosensitizing moiety.

As used herein, photosensitizing moiety means a moiety that increases the sensitivity of the polyimide to crosslinking as a result of actinic radiation.

In another aspect of the invention, photoimageable polyimides, wherein the tetravalent photosensitizing moiety is from about 30 to about 99 mole percent benzophenone moiety, have a unique property in that the solution viscosity of the photoimageable polyimide coating solution decreases as the concentration of the benzophenone is increased.

Briefly, the polymers of this invention are useful in electronic applications as coatings and can be made into flexible substrates for electrical components, interlevel dielectrics, and the like. In particular, the polymers of the present invention provide a unique photoimageable polyimide coating for microelectronic uses.

The polyimides of the present invention can also be used, for example, as an alpha particle barrier, ion-implantation mask, high temperature resist material, buffer coating layer, planarization layer, multichip module, or interlayer dielectric insulating material. In this case, multiple layers of the polyimide of the present invention can be interspaced with a conducting material, such as metal, or other materials.

BRIEF DESCRIPTION OF THE INVENTION

The present invention provides a photoimageable coating from a polyimide of the following formula

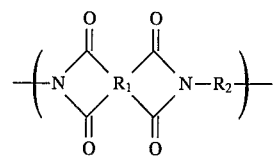

wherein $R_1$ comprises from about 1 to about 100 mole percent

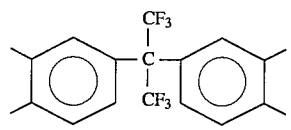

and from about 99 to about 0 mole percent tetravalent photosensitizing moiety and wherein $R_2$ comprises 1 to 100 mole percent

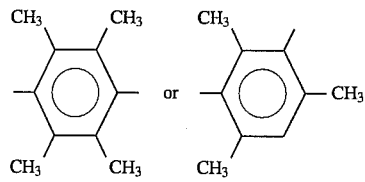

and 99 to 0 mole percent divalent photosensitizing moiety.

As used herein, photosensitizing moiety means a moiety that increases the sensitivity of the polyimide to crosslinking as a result of actinic radiation. In general, moieties which contain a chromophore can function as a photosensitizing moiety. Examples include, but are not limited to,

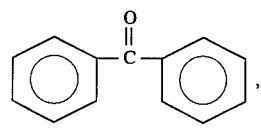

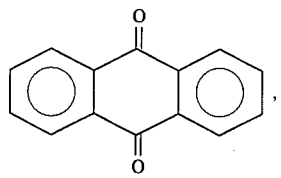

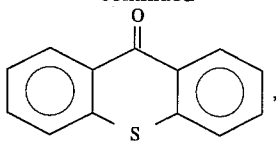

and the like. Where the photosensitizing moiety is derived from a diamine, the linkage is divalent. Where the photosensitizing moiety is derived from a dianhydride, the linkage is tetravalent. In either case, the present invention also incorporates the isomeric variants of the above-described photosensitizing moieties.

In another aspect of the invention, photoimageable polyimides, wherein the tetravalent photosensitizing moiety is from about 30 to about 99 mole percent benzophenone moiety, have a unique property in that the solution viscosity of the photoimageable polyimide coating solution decreases as the concentration of the benzophenone is increased. A lower solution viscosity means that the polymer can be spin-coated on a substrate using a higher solids content. Accordingly, fewer layers of polymer will need to be applied to produce a particular thickness of polyimide coating, for example, a thick polyimide layer of greater than about 10 microns. A more preferred range of benzophenone is from about 50 to about 99 mole percent and the most preferred is from about 50 to about 60 mole percent.

Further, the solution viscosity of a polyimide directly relates to the ability of the polymer to planarize well. The degree of planarization depends, among other things, on the solid content of the polymer solution. A higher solid content in a coating solution will generally produce a more viscous solution as measured by solution viscosity. A higher solid content composition should planarize better than a low solid content composition (Rothman, L. B., J. Electrochem. Soc., Vol 27, 2216–2220 (1980)). However, a higher solids content solution will generally have a high solution viscosity and will not spin-coat easily. Further, a higher solution viscosity polymer generally will not spin coat a uniform layer of polymer on the substrate and will produce an uneven layer of polymer. Thus, it is advantageous that the BTDA content of the polyimide is increased while, at the same time, the solution viscosity of the polyimide decreases because the coating composition can be applied to the substrate at higher concentrations of polyimide. Another advantage is that a higher solid content solution reduces the need to apply multiple coatings to achieve a particular thickness of polyimide.

Further, polyimides, in general, are used as coatings over a topographical (i.e., nonplanar) surface on a substrate. The formation of a planar polymer coating surface is particularly important in electronic applications where two or more layers of coated substrate can be stacked, one on top of the other, and the substrate layers separated by the planarized polyimide. Ideally, planarization would yield a planar surface, regardless of the complexity of the underlying topography.

A particularly preferred polyimide is a polyimide having from about 30 to about 99 mole percent BTDA relative to the dianhydride moiety of the polymer. Because of the reduction in solution viscosity, a more preferred concentration is from about 50 to about 99 mole percent BTDA.

A co-initiator may be included in the photoimageable polyimide coating composition to further increase the photosensitivity of the polymer. These co-initiators may or may not be included in the polymer backbone. Examples include, but are not limited to, anthraquinone, 2-ethylanthraquinone, 2-tert-butylanthraquinone, benzophenone, Michler's ketone, thioxanthone, 3-ketocoumarines, triethylamine, N-methyldiethanolamine, 4-(amino) methylbenzoate, 4-(dimethylamino) methylbenzoate, 4-(dimethylamino) benzaldehyde, and the like.

Where the photoimageable polyimide coating of the present invention is a copolymer, the copolymer can be either a random copolymer or a block copolymer.

The following abbreviations as used herein are defined as follows:

| ABBREVIATION | FULL NAME |
| --- | --- |
| 6FDA | 2,2-bis(3,4-dicarboxyphenyl)-hexafluoropropane dianhydride |
| APES | 3-aminopropyl triethoxysilane |
| BTDA | 3,3',4,4'-benzophenone tetracarboxylic acid dianhydride |
| DCC | 1,3-dicyclohexylcarbodiimide |
| DMDE | diaminodurene or 2,3,5,6-tetramethyl-1,4-phenylene diamine |
| GBL | gamma-butyrolactone |
| MEDA | mesitylene diamine (diaminomesitylene), or 2,4,6-trimethyl-1,3-phenylenediamine |
| NMP | N-methylpyrrolidone |
| PMDA | pyromellitic acid dianhydride |
| TMMA | 2,2',6,6'-tetramethyl-4,4'-methylenedianiline |

The photoimageable polyimide of the present invention can be prepared as the polycondensation product of components comprising 6FDA and DMDE or MEDA, or derivatives thereof, and can include a component that will contribute a photosensitizing moiety, for example, BTDA. Examples of dianhydrides that will contribute a photosensitizing moiety include, but are not limited to, 3,3',4,4'-benzophenone tetracarboxylic acid dianhydride (BTDA), 2,3,6,7-anthraquinone tetracarboxylic acid dianhydride, 2,3,6,7-thioxanthone tetracarboxylic acid dianhydride, and the like, as well as isomers thereof. Examples of diamines include, but are not limited to, the various isomers of benzophenone diamine, anthraquinone diamine, thioxanthone diamine, and the like.

Generally, polyimides are made by mixing a diamine component and a dianhydride component and adding a compatible solvent to form a solution of polyamic acid. The polyamic acid is then imidized by either chemical or thermal methods to form a polyimide.

A composition of polyimide in solution solvent is spread on a substrate to form a coating. Further, multiple layers of polyimide can be interspaced with a conducting material such as metal, or other materials to form a multilayer structure. For example, the polymer layers can act as an interlayer dielectric insulating material where layers of conducting material, for example copper or aluminum patterns, are interspaced with layers of the insulating polymer. Further, many such layers can be assembled with each layer of conducting material separated by a layer of polymer.

If vias (or openings) are desired, the polyimide coating is shielded with a mask containing a pattern of openings, and the polyimide is exposed to actinic radiation through the openings in the mask. Thus, the polyimide is photochemically altered such that, depending on the particular polymer, the areas that were exposed to actinic radiation are insoluble. Vias (or openings) can be created by taking advantage of this selective insolubility to dissolve the soluble polymer and rinse it away with one or more rinses of one or more rinse compositions, thereby leaving a pattern of insoluble polymer on the substrate. The process of creating vias is generally referred to as etching. The vias (or openings) through the polymer coating are necessary to permit access for electrical connections between layers of conducting material or between the substrate and the outside environment.

Thus, etching can be viewed as a process to dissolve selected areas of polyimide coating on a substrate with an appropriate solvent to form vias (or openings) in the coating. In general, the etching process leaves areas of undissolved polyimide over some of the substrate while dissolving and removing polyimide over other areas of the substrate, to form a pattern of polyimide.

The dianhydride component and diamine component typically are allowed to react in the presence of polar aprotic solvent to provide a polyamic acid solution. The stoichiometric ratio of the total diamine and the total dianhydride concentrations of the polymer ranges from 0.8 to 1.2, preferably 1.0. For example, a total dianhydride component made up of a tetravalent photosensitizing moiety and 6FDA can range from about 99 to about 0 mole percent tetravalent photosensitizing moiety to from about 1 to about 100 mole percent 6FDA. When the tetravalent photosensitizing moiety is BTDA, from about 30 to about 99 mole percent BTDA will result in a polyimide that will decrease in solution viscosity as the concentration of BTDA is increased. A more preferred range is from about 50 to about 99 mole percent BTDA. A range of from about 50 to about 60 mole percent BTDA will provide a polyimide with properties that are well suited for microelectronic applications.

The condensation reaction takes place at approximately room (ambient) temperature. Preferably the reaction takes place at less than 30° C. in 3 hours to several days, more preferably between 5 to 24 hours.

In greater detail, the polyamic acid is then chemically imidized using thermal or chemical means. Thermal imidization is typically carried out in the solution solvent at a temperature range typically from about 50°–300° C., preferably from about 120°–180° C., most preferably at about 150° C. Chemical imidization is generally accomplished using dehydrating agents, such as, for example, acetic anhydride or trifluoro-acetic anhydride. Other examples of suitable dehydrating agents can be found in Bessonov, M. I. et al., Polyimides—Thermally Stable Polymers, Consultants Bureau, New York, 76–82 (1987), incorporated herein by reference. A particularly suitable chemical imidization composition is the dehydrating agent, acetic anhydride, used in the presence of a catalyst such as pyridine. Also preferred are 1,3-dicyclohexylcarbodiimide (DCC), thionyl chloride, phosphorous trichloride, trifluoroacetic anhydride, and the like.

A solid polymer can be isolated from solution by precipitating the polymeric solution in low-polarity solvents, such as for example, alkanes such as pentane, hexane, heptane; alcohols such as methanol, ethanol, propanol; ethers such as diethyl ether, and the like. Preferably, the polymer is precipitated with methanol, washed with solvent, and dried in air or inert atmosphere (such as nitrogen).

The solid polymer is then dissolved in a suitable solution solvent to form a coating composition. This composition is used to apply the polyimide coating to the substrate. Examples of suitable solution solvents are polar aprotic solvents which can be used by themselves or in mixtures of two or more solvents. Suitable solution solvents, for example, ethers such as dibutyl ether, tetrahydrofuran, dioxane, methylene glycol, dimethylethylene glycol, dimethyldiethylene glycol, diethyldiethylene glycol and dimethyltriethylene glycol; halogenated hydrocarbons such as chloroform, dichloromethylene, 1,2-dichloroethane, 1,1,1-trichloroethane and 1,1,2,2-tetrachloroethane; carboxylic acid esters and lactones such as ethyl acetate, methyl propionate, ethyl benzoate, 2-methoxyethyl acetate, p-valerolactone, gamma-butyrolactone, and pivalolactone; ketones such as acetone, cyclopentanone, cyclohexanone, methyl ethyl ketone; carboxylic acid amides and lactams such as formamide, acetamide, N-methylformamide, N,N-diethylformamide, N,N-diethylacetamide, gamma-butyrolactam, epsilon-caprolactam, N-methylcaprolactam, N-acetylpyrrolidone, N-methylpyrrolidone, tetramethylurea and hexamethylphosphoric acid amide; sulfoxides such as dimethylsulfoxide; sulfones such as dimethyl sulfone, diethyl sulfone, trimethylene sulfone, tetramethylene sulfone, trimethylamine sulfone, and tetramethylene sulfone; amines such as trimethylamine, triethylamine, N-methylpiperidine, N-methylmorpholine; and substituted benzenes such as chlorobenzene, nitrobenzene, phenols, cresols, and the like. Preferred solution solvents are those that generally have high boiling points and are polar in nature, such as, for example, NMP, dimethylacetamide, diglyme, gamma-butyrolactone, N-methylformamide. Most preferred solution solvents are NMP and gamma-butyrolactone.

Generally, the polyimide solution will be diluted with the solution solvent, such as NMP, based on the thickness requirement of the final coating, the viscosity and solids content of the solution, and the spin curve data for the polymer. Typically, solutions of the polyimide are applied to the substrate with solids concentrations from about 1 to about 60 weight percent and preferably from about 5 to about 40 weight percent. The spin curve data can be obtained by spin-coating the polymer onto the substrate at various spin speeds, measuring the resulting thickness and plotting thickness versus spin speed. Clean, dry, high-purity solvent (solution solvent) is generally used as the diluent. The diluted solution is generally pressure-filtered before further processing.

In this case, the polyimide solution can be applied either statically or dynamically. In static application, the polyimide solution is dispensed to a nonrotating substrate and spread across the surface by spinning. In dynamic application, the polyimide solution is dispensed to a rotating substrate. In either case, the substrate is spun at a spin speed which is determined from the spin curve for the final coating thickness required.

Whichever application method is used, the substrate is then spun at a spin speed determined from spin curve data which is calculated to achieve the final coating thickness required. The coating is typically, between about 1 and about 30 microns in thickness.

Alternatively, the photoimageable polyimide coating can be applied to suitable carriers, or substrates, by other conventional methods, which can include, but are not necessarily limited to, dipping, brushing, casting with a bar, roller-coating, spray-coating, dip-coating, whirler-coating, cascade-coating, curtain-coating, or other methods. The solution solvent can be removed, if desired, by heating and/or convection methods.

Examples of suitable carriers, or substrates, are plastics, metal and metal alloys, semi-metals, semiconductors, such as Si, Ge, GaAs, glass, ceramics and other inorganic materials, for example, $SiO_2$ and $Si_3N_4$. Further, the substrate can be treated with an adhesion promoter, such as 3-aminopropyl triethoxysilane (APES), or dried (dehydration) to remove moisture on the surface of the substrate before the application of the polyimide coating.

Selected areas of the polyimide coating are then shielded, for example, with a mask, and the unshielded polyimide coating is exposed to actinic radiation to effect crosslinking of the polymer. This photocrosslinking is brought about by actinic, or high-energy, radiation, for example, by light within the region of 600 to 200 nm or the deep ultraviolet region, or by X-rays, laser light, electron beams, and the like.

The effect of irradiating the exposed polymer is to cause crosslinking which results in a differential solubility in the polymer coating. In this case, the exposed, irradiated polymer is more resistant towards dissolution as compared with the unirradiated portion. Hence, when the polymer is developed in a etching (developing) composition, the unirradiated parts will be dissolved away to afford a pattern on the coated polymer. The exact composition of the etching composition and the duration for each step of the developing process are generally empirically determined for each polyimide. For example, for a 50:50:100 polyimide derived from 6FDA/BTDA/DMDE, the mixed-solvent system gamma-butyrolactone and xylene is preferred.

In addition, photosensitivity is affected by the molecular weight of a particular polyimide. For example, a 6FDA/DMDE polyimide having a number molecular weight average of 26,800 g/mol was found to be photoimageable, while a 6FDA/DMDE polyimide having a number molecular weight average of 8,600 g/mol was not sufficiently crosslinked to produce the necessary discrete photoimage of 3 microns or better. Thus, the molecular weight must be sufficient to produce a photoimageable polymer. In this case, care must be taken in the preparation of the 6FDA/DMDE polymer to produce a polyimide having a number molecular weight average above approximately 20,000 g/mol. When a photosensitizing moiety is present, the number molecular weight average can be lower but is preferably above approximately 10,000 g/mol.

Etching composition application procedures can include dip-etching and spray-etching. In dip-etching, a substrate is dipped into a container of the etching composition and the polyimide is allowed to dissolve. The polymer effectively dissolves as an infinite dilution. In spray-etching, a mist of etching solution is applied to the surface of a slowly rotating (about 1000 rpm), polyimide-coated substrate. In this manner, fresh etchant is continually delivered to the surface and dissolved polymer is continually being spun off. A particular etching composition may not work. equally well in both the dip-etch and spray-etch method. Also, mechanical agitation will affect the outcome of the dip-etch application procedure.

Suitable etching (developing) compositions which can be used alone, in combination with another etching composition, or in combination with a suitable rinse composition (see below) include: ethers such as dibutyl ether, tetrahydrofuran, dioxane, methylene glycol, dimethylethylene glycol, dimethyldiethylene glycol, diethyldiethylene glycol, dimethyltrimethylene glycol; halogenated solvents such as methylene chloride, chloroform, 1,2-dichloroethane, 1,1,1-trichloroethane, 1,1,2,2-tetrachloroethane; esters and lactones such as ethyl acetate, 2-methoxyethyl acetate, gamma-butyrolactone; amides and lactams such as N,N-dimethylformamide, N,N-diethylformamide, N,N-dimethylacetamide, N,N-diethylacetamide, N-methylpyrrolidone, N-acetylpyrrolidone; sulfoxides such as dimethylsulfoxide; derivatives of benzenes such as chlorobenzene, nitrobenzene, cresols; ketones such as acetone, methyl ethyl ketone, cyclopentanone, cyclohexanone, and the like. The preferred etching compositions are N,N-dimethylformamide, N,N-dimethylacetamide, N-methylpyrrolidone, gamma-butyrolactone, cyclopentanone, and cyclohexanone. The most preferred etching composition is a mixture of gamma-butyrolactone and xylene.

Suitable rinse compositions which can be used alone or in combination include xylenes, toluene, benzene, and the like. The preferred rinse compositions are xylenes and toluene. The most preferred rinse compositions are xylenes.

Other customary additives which do not have an adverse influence on the photosensitivity of the photoimageable polyimide coating can be incorporated in the coating during preparation of the coating composition. Examples of these additives are delustering agents, flow control agents, fine-particled fillers, flameproofing agents, fluorescent brighteners, antioxidants, light stabilizers, stabilizers, dyes, pigments, adhesion promoters and antihalo dyes.

The following examples will serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

Unless otherwise indicated, all percents used are weight percents.

All monomers were stored under nitrogen atmosphere.
Inherent Viscosity (IV)

Inherent viscosity was determined from 0.5% w/v solution of the polyimide in NMP at 25° C.
Solution Viscosity Solution viscosity was determined using a Brookfield Viscometer as described in ASTM D789-86.
Glass Transition Temperature (Tg) by Thermal Mechanical Analysis (TMA)

Tg was determined as described in ASTM E37, part 41.
Molecular Weight

Molecular weight was determined by Gel Permeation Chromatography (GPC) as described in ASTM D3593-80.
Dielectric Constant (Epsilon)

Measurements of dielectric constant were made on thin films (0.7 to 2 mils thick) cast from polyamic acid solutions onto glass plates and thermally cured. The measurements were made using a two-fluid cell technique as described in ASTM D150.
Moisture Absorption and Change in Dielectric Constant (Electrical Method)

Moisture absorption measurements were made on wafer-level capacitor structures. Three-layer structures of aluminum/polymer/aluminum were fabricated on silicon wafers as set forth in U.S. Ser. No. 436,301, filed on Nov. 13, 1989, incorporated herein by reference. Aluminum thickness was 0.6 microns, polymer thickness was 1 to 2 microns, and capacitor size was 0.01 square centimeters. Capacitance of the structures was measured between 50° C. and 300° C. The moisture absorption values were calculated based on the difference between the measured 1 MHz dielectric constants at 50° C. for the first and second heats of the test according to the formula:

$$\text{Equilibrium Moisture at 100\% Relative Humidity (R.H.)} \cong \frac{2\Delta(\text{epsilon})}{0.4}$$

which formula is based upon 2 percent equilibrium moisture per unit change in epsilon, and where $\Delta(\text{epsilon})$ is the change in dielectric constant between the first and second heats. The start of the first heat is assumed to be at 40% R.H. as the wafers were allowed to equilibrate for two days at 40% R.H. prior to testing. The start of the second heat is assumed to be approximately 0% R.H. as the wafers were reheated immediately after the water was driven off during the first heat. The change in dielectric constant at 40% R.H. is the percent difference between the measured 1 MHz dielectric constants at 50° C. for the first and second heats of the test.

Starting Materials 3,3',4,4'-Benzophenone tertracarboxylic acid dianhydride (BTDA, 99.7% purity by Differential Scanning Calorimetry (DSC) method) was obtained from Allco (Pittsburgh, Kans.).

2,3,5,6-Tetramethyl-1,4-phenylene diamine (DMDE) was obtained from Aldrich Chemical Company (Milwaukee, Wis.).

2,4,6-trimethyl-1,3-phenylenediamine (MEDA) was obtained from Aldrich Chemical Company (Milwaukee, Wis.).

Hexafluoroisopropylidenebis(phthalic dianhydride) (6FDA), electronic grade, was obtained from Hoechst America (Dallas, Tex.). The 6FDA was further recrystallized in a mixed solvent (acetic anhydride/acetic acid 1:3 v/v) and dried to constant weight (130° C.; 1 mm Hg) to provide a white solid of 99.4% purity.

Photosensitivity

Photosensitivity was measured as the incident input energy (or dose) per unit area at a particular polyimide thickness that was required to effect crosslinking. Evidence of crosslinking, therefore, indicated that a particular polymer was photosensitive. In this case, the photosensitivity of the polymer was determined by calculating the amount of light that affected the photocrosslinking in the polymer sufficiently to produce a discrete image of 3 microns or better. In order to determine the photosensitivity of the polymer of interest, a substrate was spin-coated with a polymer solution composed of about 14% solid content, by weight of the polymer, in a processable solvent such as gamma-butyrolactone (GBL).

The polymer was soft-baked at approximately 110° C. for approximately 10 minutes. Soft baking depended on the thickness of the polymer film. Generally, a thicker film required a longer heating time and possibly higher heating temperatures. Typically, the preferred ranges were approximately 90°–170° C. and 10–60 minutes.

After a soft bake step, the polymer was exposed to actinic radiation through a multidensity resolution target mask for a predetermined length of time to produce a latent image. The latent image was then developed by contacting the polymer with an experimentally determined mixture of etching composition in order to remove the unexposed polymeric areas. The polymeric layer containing the high-resolution images resulting from the photocrosslinking was then dried under a steady stream of nitrogen and then hard-baked. Hard baking was generally accomplished at a temperature range of 100°–400° C. and was divided into experimentally determined stepwise stages, for example, 200° C. for 1 hour, then 350° C. for 1 additional hour. The final coating was examined under a microscope.

Polymer Cure

Soft-bake cure was accomplished with a hot plate (Solitec).

Hard-bake cure was accomplished in a convection oven under nitrogen.

Image development

Image development was accomplished by manual agitation in a fresh bath of etching (developing) composition or by spray-etching using the spin-coating equipment (Solitec).

Adhesion promoter

An adhesion promoter (0.05% solution of 3-aminopropyl triethoxysilane (APES) in a mixture of methanol and water in a 95:5 volume ratio) was applied to each of the substrates before spin-coating the polyimide coating on the substrate.

Microlithography

Microlithography was performed in a clean room using a Karl Zuss lithographic system (model MJB3). The light source was broadband (lambda>330 nm) where the incident light intensity was automatically regulated to a constant value of 10 mW/cm$^2$, as measured at 365 nm. The lithographic mask used was a Ditric Series I (Ditric Optics Inc., Massachusetts).

EXAMPLE 1

Polyimide from 6FDA/DMDE

6FDA was recrystallized in a mixed solvent (acetic anhydride/acetic acid 1:3 v/v) and dried to constant weight (130° C.; 1 mm Hg) to provide a white solid of 99.4% purity.

Into a 2-liter jacketed polymer reactor was added, in the following order, DMDE (14.781 g), 6FDA (39.983 g), and NMP (211 mL). The reaction was stirred for 16 hours at 18° C. The reaction mixture was then diluted with 66 mL of NMP. Next, a solution comprised of acetic anhydride (25.5 mL), pyridine (10.9 mL), toluene (23.3 mL), and NMP (20 mL) was added to the reaction mixture with vigorous stirring and the reaction was heated to 50° C. and kept at that temperature for 3 hours while vigorous stirring was maintained. The reaction mixture was cooled to approximately room temperature and methanol (1000 mL) was slowly added to affect the precipitation of a creamy-white polymer. The polymer was treated with repeated washing (with methanol) and filtration. The resulting polymer was found to be photoimageable by microlithography radiation and the polymer solution was clear and almost colorless.

Yield 52.6 g (96%) Inherent viscosity (0.5% solution in NMP) 0.97 dL/g Tg (TMA) 369° C. Solution viscosity (Brookfield, 12% solids in GBL) 8,717 cps GPC: Mn 25,000 g/mol; Mw 47,800 g/mol; Mz 77,250 g/mol Spin-coating of the adhesion promoter (APES)

Spread 0.5K rpm for 5 sec

Spin 5K rpm for 15 sec

Bake 100° C. for 30 sec

Spin-coating 6-FDA/DMDE polymer solution, 10% solids in GBL

Spread 0.5K rpm for 5 sec

Spin 4.0K rpm for 15 sec

Bake 110° C. for 10 min

Microlithography

Irradiation 90 sec at 10 mJ/cm$^2$

Spray-etching

Etching composition (xylene: GBL 1.0:1.75 v/v) 1.0K rpm for 99 sec

Overlap 1.0K rpm for 10 sec

Rinse composition (xylene) 1.0K rpm for 15 sec

Spin dry 3.0K rpm for 15 sec

COMPARATIVE EXAMPLE A

Polyimide from BTDA/DMDE

A clean and dry, 100-mL glass reactor was charged in the following order; DMDE (2.464 g), BTDA (4.834 g), and NMP (65.68 g). The remainder of the glass reactor was assembled and purged with nitrogen for about 5 minutes. Stirring was started and continued for 16 hours, at which time the solution became a viscous and straw-like solution of 10% solid (inherent viscosity 1.18 dL/g). The polymer solution was further treated with acetic anhydride, pyridine (8 mL), benzene (16 mL), and NMP (14 mL), and the resulting solution was maintained at 50° C. with agitation for 2 hours to give an orange viscous solution. Precipitation in methanol (1400 mL) gave a light yellow solid which was further treated in a blender with 200 mL of methanol before the precipitate was filtered under reduced pressure and dried overnight under high vacuum (0.1 mm) to give a yellow-orange fluffy solid. The polymer solution made from this solid (12% solid in GBL) was highly colored, which is not a preferred attribute for a photoimageable polyimide. A highly colored polymer will interfere with light transmission within the polymer and reduce crosslinking, therefore reducing the ability to pattern thick films of polymer.

Yield 5.54 grams (76%) Inherent viscosity (0.5% solution in NMP) 0.53 dL/g Tg (TMA) 368° C. Dielectric constant (zero % relative humidity; 1 MHz) 2.94 Moisture pickup (electrical method) 3.7%

COMPARATIVE EXAMPLE B

Polyimide from BTDA/MEDA

Using BTDA (9.665 g) and MEDA (4.506 g), Comparative Example B was prepared in a manner similar to Example 1 above to provide approximately 110 g of polyimide.

Inherent viscosity (0.5% solution in NMP) 0.39 dL/g GPC: Mn 5,190 g/mol; Mw 11,490 g/mol; Mz 20,090 g/mol A solution of this polymer (10% solids in GBL) gelled within 2 days upon standing at room (ambient) temperature.

EXAMPLE 2

Polyimide from 6FDA/BTDA/DMDE (50:50:100)

This polymer was synthesized using a procedure similar to the one described in Example 1. The amounts of materials used were: DMDE (81.14 g), BTDA (58.86 g), 6FDA (60.00 g), and NMP (795.15 g). For chemical imidization the polymer was treated with a mixture composed of acetic anhydride (108 mL), pyridine (51 mL), toluene (125 mL), and NMP (88 mL). Precipitation in methanol (14 L) and filtration under reduced pressure afforded 17 6.6 g (94%) after drying under high vacuum. The polymer was isolated by precipitating the resulting polymeric solution in methanol, washing with extra methanol, and drying in air or in inert atmosphere to give a solid polymer.

Inherent viscosity (0.5% solution in NMP) 0.98 dL/g Tg (TMA) 361° C. Dielectric constant (0% relative humidity, 1 MHz) 2.83 Moisture pickup (electrical method) 2.9%. Solution viscosity (Brookfield, 12% solids in GBL) 7840 cps GPC: Mn 16,400 g/mol; Mw 32,400 g/mol; Mz 54,750 g/mol Photosensitivity 64 mJ/cm$^2$ at approximately 2 micron

EXAMPLE 3

Polyimide from 6FDA/BTDA/DMDE (10:90:100)

Using 6FDA (4.452 g), BTDA (29.078 g), and DMDE (16.468 g), Example 3 was prepared in a manner similar to Example 1 above to provide approximately 44 g of polyimide.

Inherent viscosity (0.5% solution in NMP) 0.93 dL/g Solution viscosity (Brookfield, 12% solid in GBL) 1545 cps GPC: Mn 11,300 g/mol; Mw 31,600 g/mol; Mz 57,200 g/mol Photosensitivity 320 mJ/cm$^2$ at approximately 6 microns

EXAMPLE 4

Polyimide from 6FDA/BTDA/DMDE (40:60:100)

Using 6FDA (38.41 g), BTDA (38.41 g), and DMDE (38.24 g), Example 4 was prepared in a manner similar to Example 1 above to provide approximately 190.7 g of polyimide.

Inherent viscosity (0.5% solution in NMP) 0.95 dL/g Solution viscosity (Brookfield, 12% solid in GBL) 5,300cps GPC: Mn 16,150 g/mol; Mw 30,150 g/mol; Mz 51,000 g/mol Photosensitivity 90 mJ/cm$^2$ at approximately 3 microns

EXAMPLE 5

Polyimide from 6FDA/BTDA/MEDA (10:90:100)

Using 6FDA (4.440 g), BTDA (29.000 g), and MEDA (15.000 g), Example 5 was prepared in a manner similar to Example 1 above to provide approximately 42.8 g (95.4%) of polyimide.

Inherent viscosity (0.5% solution in NMP) 0.76 dL/g Solution viscosity (Brookfield, 12% solid in GBL) 166 cps

EXAMPLE 6

Polyimide from 6FDA/BTDA/MEDA (50:50:100)

Using 6FDA (22.200 g), BTDA (16.100 g), and MEDA (15.000 g), Example 6 was prepared in a manner similar to Example 1 above to provide approximately 46.5 g (93.4%) of polyimide.

Inherent viscosity (0.5% solution in NMP) 0.82 dL/g Solution viscosity (Brookfield, 12% solid in GBL) 255 cps

EXAMPLE 7

Polyimide from 6FDA/BTDA/MEDA (70:30:100)

Using 6FDA (31.100 g), BTDA (9.670 g), and MEDA (15.000 g), Example 7 was prepared in a manner similar to Example 1 above to provide approximately 49.5 g (95%) of polyimide.

Inherent viscosity (0.5% solution in NMP) 0.85 dL/g Solution viscosity (Brookfield, 12% solid in GBL) 374 cps As seen in TABLE I below, the solution viscosity (Brookfield viscosity) of a particular polymer decreases as the proportion of BTDA increases.

TABLE I

| Example Number | Polymer | Monomer Ratio | Inherent Viscosity (dL/g)* | Solution Viscosity (cps)** |
|---|---|---|---|---|
| 3 | 6FDA/BTDA/DMDE | 10:90:100 | 0.93 | 1545 |
| 4 | 6FDA/BTDA/DMDE | 40:60:100 | 0.95 | 5300 |
| 2 | 6FDA/BTDA/DMDE | 50:50:100 | 0.98 | 7840 |
| 1 | 6FDA/BTDA/DMDE | 100:0:100 | 0.97 | 8700 |
| 5 | 6FDA/BTDA/MEDA | 10:90:100 | 0.76 | 166 |
| 6 | 6FDA/BTDA/MEDA | 50:50:100 | 0.82 | 255 |
| 7 | 6FDA/BTDA/MEDA | 70:30:100 | 0.85 | 374 |

TABLE I-continued

| Example Number | Polymer | Monomer Ratio | Inherent Viscosity (dL/g)* | Solution Viscosity (cps)** |
|---|---|---|---|---|

*inherent viscosity of the polyimide
**12% solid content in GBL

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

That which is claimed is:

1. A process for etching a photoimageable polyimide coating comprising:

(a) coating a substrate with a layer of a photoimageable polyimide comprising recurring units of

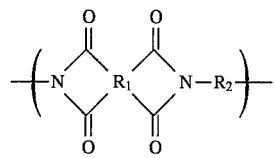

wherein $R_1$ comprises from about 70 to about 10 mole percent

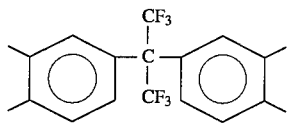

and from about 30 to about 90 mole percent

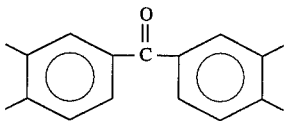

and wherein $R_2$ consists essentially of

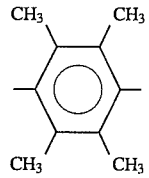

b) shielding selected areas of the photoimageable polyimide coating with a shield to provide a pattern of covered photoimageable polyimide coating and exposed photoimageable polyimide coating;

c) crosslinking the exposed photoimageable polyimide coating with actinic radiation;

d) removing the shield; and e) removing the unexposed photoimageable polyimide coating with an etching composition.

2. The process of claim 1 wherein $R_1$ comprises from about 60 to about 40 mole percent

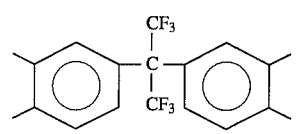

and from about 40 to about 60 mole percent

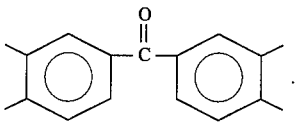

3. The process of claim 1 wherein $R_1$ comprises from about 60 to about 50 mole percent

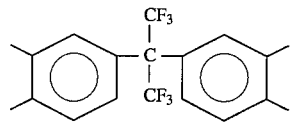

and from about 40 to about 50 mole percent

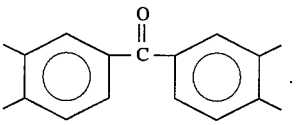

4. The process of claim 1 wherein $R_1$ comprises about 50 mole percent

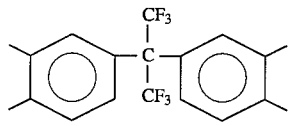

and about 50 mole percent

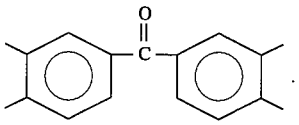

5. The process of claim 4, wherein the number average molecular weight of said photoimageable polyimide is sufficient to provide an image resolution of at least 3 microns and is at least 10,000 g/mol.

6. The process of claim 5, wherein the number average molecular weight of said photoimageable polyimide is at least 20,000 g/mol.

7. The process of claim 1 wherein the photoimageable polyimide further includes a co-initiator.

8. The process of claim 1, wherein the number average molecular weight of said photoimageable polyimide is sufficient to provide an image resolution of at least 3 microns and is at least about 10,000 g/mol.

9. The process of claim 8, wherein the number average molecular weight of said photoimageable polyimide is at least about 20,000 g/mol.

10. The process of claim 1 wherein said substrate is selected from the group consisting of silicon, silicon dioxide, silicon nitride, silicon oxynitride, aluminum nitride, gallium arsenide, aluminum oxide, beryllium oxide, tantalum nitride, glass, metal, metal alloys, semi-metals, ceramics, and inorganic materials.

* * * * *